US005739694A

United States Patent [19]

Grochulski

[11] Patent Number: 5,739,694
[45] Date of Patent: Apr. 14, 1998

[54] APPARATUS FOR TESTING OPERATION OF A DISPLAY PANEL ADAPTED TO BE CONNECTED TO A DRIVE MECHANISM BY AN ELECTRICAL CABLE OF PREDETERMINED CONNECTOR CONFIGURATION

[75] Inventor: Frederick R. Grochulski, West Bloomfield, Mich.

[73] Assignee: Livernois Research and Development, Dearborn, Mich.

[21] Appl. No.: 580,847

[22] Filed: Dec. 29, 1995

[51] Int. Cl.$^6$ .................................................. G01R 31/02
[52] U.S. Cl. ........................ 324/556; 324/508; 345/214
[58] Field of Search .............................. 324/66, 508, 555, 324/556, 537; 345/214

[56] References Cited

U.S. PATENT DOCUMENTS 4,924,179  5/1990  Sherman .......................... 324/537 X
5,168,238  12/1992  Larance ............................ 324/556

*Primary Examiner*—Maura K. Regan
*Attorney, Agent, or Firm*—Barnes, Kisselle, Raisch, Choate, Whittemore & Hulbert

[57] ABSTRACT

Apparatus for testing operation of a vehicle instrument panel that includes first and second electrical connectors each of predetermined connector configuration and each having a predetermined number of individually identified electrical contacts arrayed in identical series. An array of electrical switches is disposed on an operator panel, with each of the switches having a pair of switch contacts respectively connected to corresponding identically identified contacts of the first and second connectors. Each of the switches has facility on the operator panel responsive to an operator for selectively individually closing or opening each of the switches to interconnect or disconnect within the apparatus the corresponding connector contacts of the first and second connectors. A pair of single-conductor jacks are disposed on the panel adjacent to each of the switches, with each of such jacks being connected to a corresponding contact of the adjacent switch. Printed indicia are affixed to the panel adjacent to each of the switches and the corresponding pair of jacks for identifying the contacts of the first and second connectors associated with the adjacent switch and jacks.

8 Claims, 2 Drawing Sheets

APPARATUS FOR TESTING OPERATION OF A DISPLAY PANEL ADAPTED TO BE CONNECTED TO A DRIVE MECHANISM BY AN ELECTRICAL CABLE OF PREDETERMINED CONNECTOR CONFIGURATION

The present invention is directed to electrical test apparatus, and more particularly to an apparatus for testing operation of a display panel such as an automobile instrument panel.

BACKGROUND AND SUMMARY OF THE INVENTION

In conventional automotive vehicles, one or more operator instrument panels are connected by suitable electrical cables or harnesses to panel drive mechanisms such as a vehicle computer. To test an instrument panel assembly, the instrument panel is connected to a panel drive mechanism either before or after installation of the panel in a vehicle, and panel operation is observed under varying test conditions. However, there is no mechanism for readily isolating and identifying instrument panel faults, or faults in the panel interconnection cable. Rather, a faulty panel or panel interconnection conventionally requires laborious testing by a technician to identify the failure or connection fault. It is a general object of the present invention to provide a test apparatus that facilitates testing of display panels, such as automotive instrument panels, by isolating the individual interconnection lines and providing a mechanism for separately testing and energizing each interconnection line individually.

Apparatus for testing operation of a display panel, such as a vehicle instrument panel, in accordance with a presently preferred embodiment of the invention comprises first and second electrical connectors each of predetermined connector configuration identical to configuration of the panel interconnection cable and each having a predetermined number of individually identified electrical contacts arrayed in identical series. An array of electrical switches is disposed on an operator panel, with each of the switches having a pair of switch contacts respectively connected to corresponding identically identified contacts of the first and second connectors. Each of the switches has facility, preferably on the operator panel and responsive to an operator, for selectively individually closing each of the switches to interconnect within the apparatus the corresponding connector contacts of the first and second connectors, and opening each of the switches to disconnect from each other the corresponding contacts of the first and second connectors. A pair of third electrical connectors are disposed on the panel, preferably adjacent to each of the switches, with each of such third connectors being connected to a corresponding contact of the adjacent switch, such that each such pair of third electrical connectors is connected in parallel with the adjacent switch. Printed indicia is affixed to the panel adjacent to each of the switches and the corresponding pair of third connectors for identifying the contacts of the first and second connectors associated with the adjacent switch and third connectors.

The switches, pairs of third connectors and indicia are disposed on the operator panel in the preferred embodiment of the invention in an array of configuration identical to the identical configurations of the first and second connectors. Each of the third connectors in the preferred embodiment comprises a plug-type single-conductor connector. In this way, the operator may selectively access each interconnection between the display panel and panel drive mechanism not only to test continuity of the interconnection cable or harness by means of the associated switch, but also functionally to test the interconnection and associated portion of the display panel by access to the interconnection through the third conductor pair.

An electric meter is disposed on the operator panel in the preferred embodiment of the invention, and a pair of third connectors are disposed adjacent to the meter for selectively electrically connecting the meter across one of the switches. The apparatus also includes a source of electrical power and third electrical connectors on the panel for selectively connecting such source of electrical power to one or more of the switches. A variable resistor or potentiometer is coupled to the power supply and to a knob on the operator panel for selectively varying level of electrical power available at the panel connectors.

BRIEF DESCRIPTION OF THE DRAWINGS

The invention, together with additional objects, features and advantages thereof, will be best understood from the following description, the appended claims and the accompanying drawings in which:

DETAILED DESCRIPTION OF PREFERRED EMBODIMENT

Figure 1:
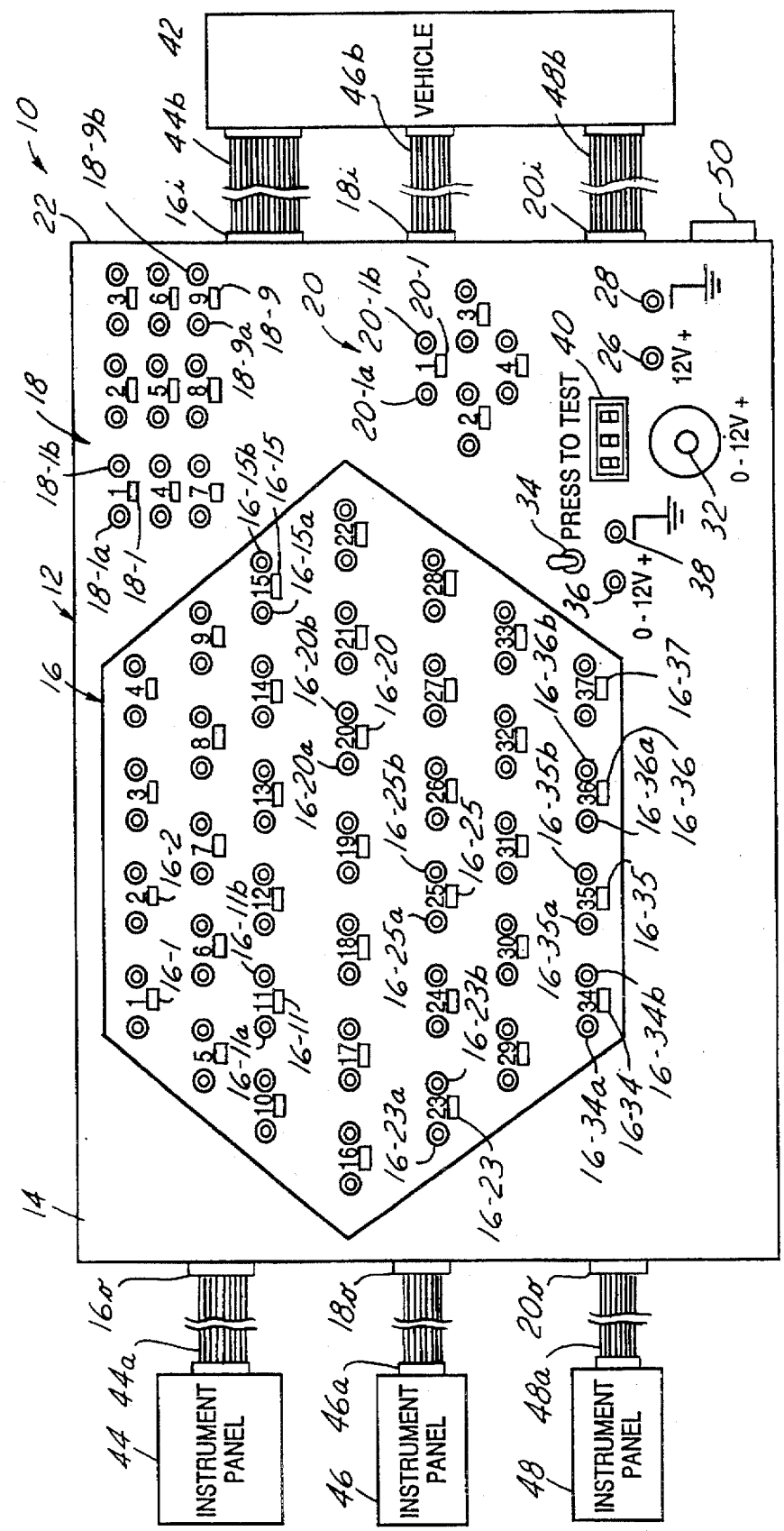
FIG. 1 is a functional block diagram of display panel test apparatus in accordance with a presently preferred embodiment of the invention.

FIG. 1 illustrates apparatus 10 for testing operation of display panels in accordance with a presently preferred embodiment of the invention as comprising a generally rectangular housing 12 having a flat operator panel 14. Three input connectors 16$i$,18$i$,20$i$ are disposed on one end panel 22 of enclosure 12, and three corresponding output connectors 16$o$,18$o$ and 20$o$ are disposed on the opposing end panel 22 of enclosure 12. Connectors 16$i$,16$o$ are of identical predetermined configuration, and each have a predetermined number of individually identified connector contacts arrayed in identical series. Connectors 16$i$,16$o$ may be male and female, or both male or both female, depending upon the interconnection configuration of the instrument panel and panel command mechanism to be tested. Likewise, connectors 18$i$,18$o$ are of identical configuration and have identical arrays of individually identified contacts, and connectors 20$i$,20$o$ are of identical configuration and have identical individually identified contact arrays.

Figure 2:
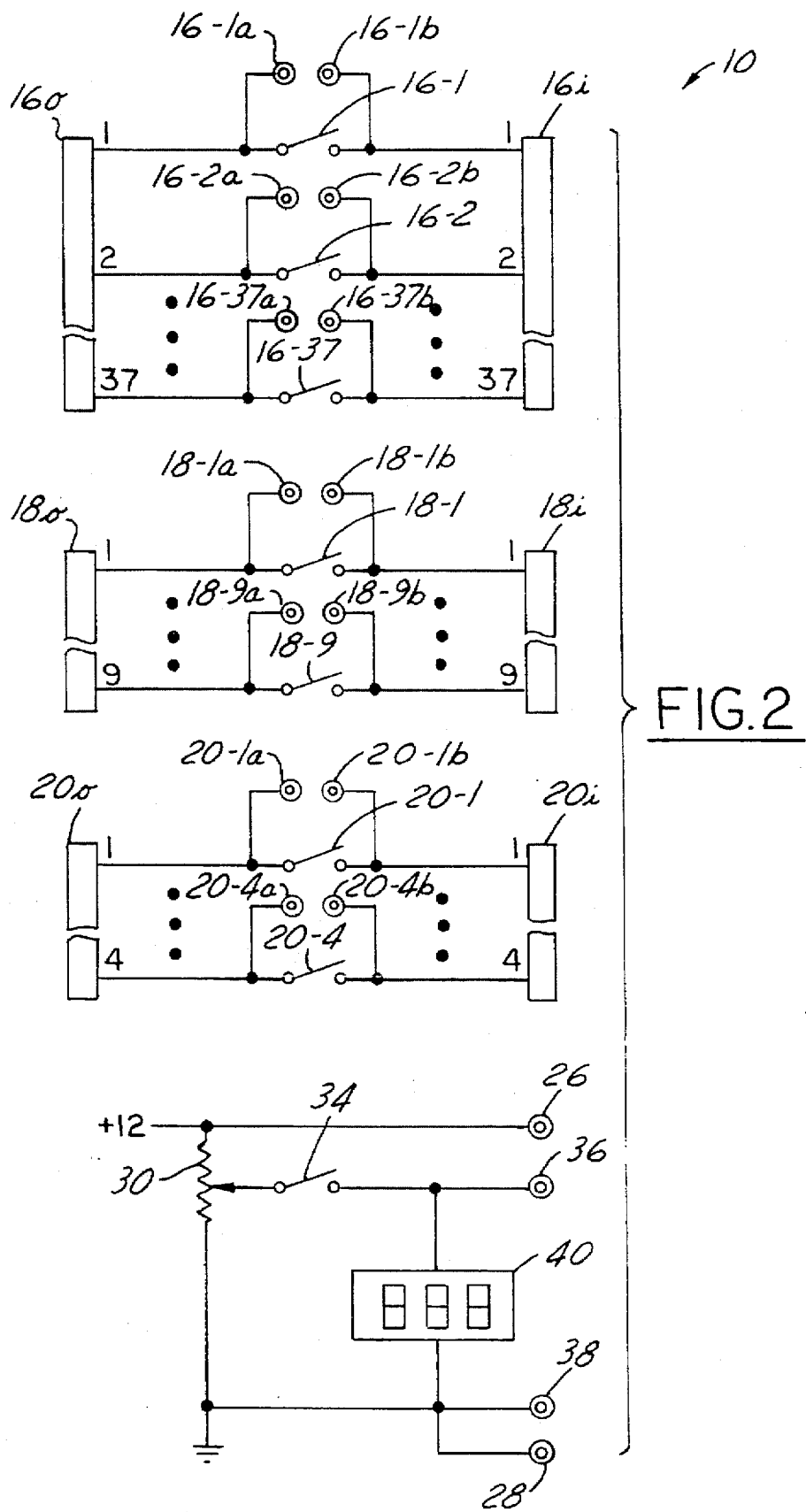
FIG. 2 is a fragmentary electrical schematic diagram of the test apparatus illustrated in FIG. 1.

A plurality of electrical switches 16-1,16-2, . . . 16-37 (FIGS. 1 and 2) are mounted on panel 14. As illustrated in FIG. 2, each switch 16-1 through 16-37 comprises a single-pole switch having a pair of switch contacts respectively electrically connected to the correspondingly identically identified contacts of connectors 16$i$,16$o$. That is, the contacts of switch 16-1 are respectively connected to contacts "1" of connectors 16$i$,16$o$, the contacts of switch 16-2 are respectively connected to contacts "2" of connectors 16$i$, 16$o$, and so on to the contacts of switch 16-37 that are respectively electrically connected to contacts "37" of switches 16$i$,16$o$. Each switch 16-1 through 16-37 also has a switch actuator on panel 14 responsive to an apparatus operator for selectively closing or opening interconnection between the associated pair of contacts in connectors 16$i$, 16$o$. That is, when switch 16-1 is closed, contacts "1" of connectors 16i,16o are connected to each other, and contacts "1" of connectors 16i,16o are disconnected from each other when switch 16-1 is open. A pair of single-conductor plug-type connectors or jacks 16-1a,16-1b are disposed adjacent to switch 16-1 on operator panel 14, and are electrically connected to the respective contacts of switch 16-1. Likewise, a pair of single-conductor plug-type connectors or jacks 16-2a, 16-2b are electrically connected across switch 16-2, and a pair of single-conductor plug-type connectors are disposed adjacent to and electrically connected across each of the remaining switches 16-3 through 16-37. Thus, with switch 16-1 open, for example, connectors 16-1a and 16-1b afford operator access to the interconnection between contacts "1" of connectors 16i,16o for measuring current flow through this interconnection line.

As illustrated in FIG. 1, switches 16-1 through 16-37, and the associated pairs of connectors 16-1a,16-1b through 16-37a,16-37b, are disposed in a generally hexagonal array 16. This array geometry and layout is physically identical to the array configuration of contacts in the associated connectors 16i,16o. Alphanumeric indicia "1," "2," . . . "37" are printed or otherwise affixed to panel 14 adjacent to each associated switch and pair of connectors for identifying the associated contacts of connectors 16i,16o. That is, numeric indicia "1" is disposed adjacent to switch 16-1 and connectors 16-1a,16-1b for identifying the associated contacts "1" of connectors 16i,16o, etc. (Where connectors 16i,16o are of a type having letter contact identification rather than numeric contact identification, the associated indicia on panel 14 would be letter indicia.)

Each pair of connectors 18i,18o and 20i,20o also have an associated array 18,20 of switches, connectors and indicia on panel 14. That is, a single-pole electrical switch 18-1 has respective contacts connected to contacts "1" of connectors 18i,18o, and an actuator on panel 14 for selectively opening and closing connection between such contacts. Similarly, a switch 20-1 is electrically connected between contacts "1" of connectors 20i,20o. Each switch 18-1 through 18-9 of array 18, and each switch 20-1 through 20-4 of array 20, has a pair of single-conductor plug-type connectors or jacks connected across the connector contacts. That is, connectors 18-1a, 18-1b are electrically connected across the contacts of switch 18-1, etc., and connectors 20-1a,20-1b are electrically connected across the contacts of switch 20-1, etc. Each of the switches and associated pair of connectors in arrays 18,20 have adjacent associated alphanumeric indicia "1," "2," etc. printed or otherwise affixed adjacent thereto for identifying the associated contacts of connectors 18i,18o and 20i,20o. As was the case with switch/connector/indicia array 16, switch/connector/indicia arrays 18,20 are disposed on panel 14 in geometric configurations identical to the corresponding configurations of contacts within connectors 18i,18o and 20i,20o. Thus, in the specific example illustrated in FIGS. 1 and 2, there are thirty-seven contacts in connectors 16i,16o, nine contacts in connectors 18i,18o and four contacts in connectors 20i,20o, all individually identified by number "1," "2," etc.

A pair of single-conductor plug-type connectors or jacks 26,28 are disposed on panel 14 of apparatus 10, and are electrically connected within the panel to an internally regulated external source of electrical power at the supply voltage and electrical ground. A connector 50 (FIG. 1) provides for connection to the external power source. A variable resistor or potentiometer 30 is electrically connected across the d.c. power source, and is coupled to a rotary knob 32 (FIG. 1) on panel 14. A momentary contact switch or pushbutton 34 connects potentiometer 30 to a connector 36 on panel 14 for supplying electrical power at a level that varies under control of potentiometer 30 and knob 32. A ground connector 38 is disposed adjacent to connector 36 on panel 14. An electrical meter 40 is connected between connectors 36,38 for providing a digital display of voltage across or current between the connectors. Indicia "PRESS TO TEST" is printed or otherwise affixed on panel 14 adjacent to momentary contact switch 34. Indicia "12V+" is fixed on panel 14 adjacent to connector 26, and indicia "0–12V+" is printed adjacent to connector 36 and knob 32. Ground symbols are affixed adjacent to connectors 28,38.

In operation, apparatus 10 is connected between one or more display panels and an associated display drive(s). In the illustration of FIG. 1, apparatus 10 is connected between an automotive vehicle or vehicle simulator 42 and three automobile instrument panels 44,46,48. Instrument panel 44 has a cable 44a that is connected to apparatus connectors 16o. Similarly, panels 46,48 have respective cables 46a,48a connected to apparatus connectors 18o,20o. Corresponding cables 44b,46b and 48b connect vehicle or vehicle simulator 42 to respective connectors 16i,18i,20i. Preferably, either cable 44a or 44b comprises the interconnection cable that will eventually connect panel 44 in a vehicle to the corresponding display drive means. The other cable is a dummy cable used for interconnection and panel test purposes. Likewise, either cable 46a or 46b comprises the panel interconnection cable while the other comprises a test cable, and either cable 48a or 48b comprises the associated instrument panel connection cable while the other comprises a test cable.

With panel 44 so connected to vehicle or vehicle simulator 42 through cables 48a,48b as shown in FIG. 1, all switches 16-1 through 16-37 are initially closed. Activation of vehicle or vehicle simulator 42 thus energizes panel 44, and correct operation may be observed by the operator. Switches 16-1 through 16-37 may be selectively opened to observe effect upon panel 44. If such action does not have the expected effect, operation of panel 44 may be further tested by connecting connectors 36,38 and meter 40 by suitable jumpers to the associated connectors adjacent to the switch of interest so as to observe voltage and/or current through the interconnection. Alternatively, voltage may be applied to the connection of interest to instrument panel 44 by connecting connector 26 or 36 through suitable jumpers to the switch connector of interest. For example, connector 36 (FIGS. 1 and 2) may be connected to connector 16-1a with switch 16-1 open so as to apply electrical power to the instrument of panel 44 connected to contact "1" of connector 16o via cable 44a. If such test does not have the expected effect within panel 44, panel repair may be indicated, or misconnection of conductors in cable 44a may be indicated. In this respect, it will be appreciated that disposition of switch/connector/indicia 16 in the same geometric pattern and layout as connector 16o and cable 44a will facilitate operator repair of any cable misconnection. Testing of panels 46,48 through switch/connector/indicia arrays 18,20 proceeds in a similar fashion.

There is thus provided in accordance with the present invention an apparatus for testing operation of one or more display panels that provides both versatility and ease of use for testing a number of potential problems or faults. The preferred embodiment of the invention herein disclosed is subject to many modifications and revisions. For example, the manual panel switches may be replaced by eletronic switches coupled to an internal or external controller for automating the test sequence. The apparatus may be connected to internal or external data acquisition and/or display units to record or display testing events as they occur. The unit may have an I/O port for connection to external control or display mechanics. The unit may be adapted for fiberoptic, hydraulic or pneumatic functions and tests. The unit may be made with an internal power supply, such as a battery supply. Internal or external function generators may be employed to simulate desired signal patterns. The number of channels may, of course, be increased or decreased. Larger wires, switches and plugs may be employed to increase current and/or voltage capability.

I claim:

1. Apparatus for testing operation of a display panel adapted to be connected to drive means by an electrical cable of predetermined connector configuration, said apparatus comprising:

a first connector of the same said predetermined connector configuration for connection to said drive means, a second connector of the same said predetermined connector configuration for connection to said display panel, each of said first and second connectors having a predetermined number of connection contacts arrayed in identical series and individually identified, an operator panel, an array of electrical switch means disposed on said operator panel, each of said switch means having a pair of switch contacts respectively connected to corresponding identically identified contacts of said first and second connectors, and means on said panel responsive to an operator for selectively closing each of said switch means to interconnect within said apparatus the corresponding connector contacts and opening each of said switch means to disconnect from each other the said corresponding connectors contacts of said first and second connectors, a pair of third electrical connectors on said operator panel adjacent to each of said switch means, each of said third connectors being connected to a corresponding contact of the adjacent said switch means such that each said pair of third electrical connectors is connected in parallel with the adjacent said switch means, and indicia on operator panel adjacent to each said switch means and the corresponding pair of said third connectors for identifying the contacts of said first and second connectors associated with said adjacent switch means and pair of third connectors.

2. The apparatus set forth in claim 1 wherein said switch means, said pair of third connectors and said indicia are disposed on said operator panel in an array of geometric configuration and layout identical to said configurations of said first and second connectors.

3. Apparatus for testing operation of a display panel adapted to be connected to drive means by an electrical cable of predetermined connector configuration, said apparatus comprising:

a first connector of the same said predetermined connector configuration for connection to said drive means, a second connector of the same said predetermined connector configuration for connection to said display panel, each of said first and second connectors having a predetermined number of connection contacts arrayed in identical series and individually identified, an array of electrical switch means each having a pair of switch contacts respectively connected to corresponding identically identified contacts of said first and second connectors, and means for selectively closing each of said switch means to interconnect within said apparatus the corresponding connector contacts and opening each of said switch means to disconnect from each other the said corresponding connectors contacts of said first and second connectors, indicia for identifying the contacts of said first and second connectors associated with each of said switch means, an operator panel having said switch means and said indicia disposed thereon in an array of geometric configuration and layout identical to said predetermined configurations of said first and second connectors, and a pair of third electrical connectors on said operator panel adjacent to each of said switch means, each of said third connectors being connected to a corresponding contact of the adjacent said switch means such that each pair of third electrical connectors is connected in parallel with the adjacent said switch means.

4. The apparatus set forth in claim 2 or 3 wherein each of said third connectors comprises a plug-type single-conductor connectors.

5. The apparatus set forth in claim 1 or 3 further comprising fourth and fifth electrical connectors of configurations identical to each other and different from said first and second connectors, a second array of electrical switch means disposed on said operator panel and having switch contacts respectively connected to corresponding identically identified contacts of said fourth and fifth connectors, and means on said operator panel for selectively closing each of said switch means of said second array to interconnect within said apparatus the corresponding connector contacts of said fourth and fifth connectors and opening each of said switch means of said second array to disconnect the said corresponding connector contacts from each other, a pair of said operator third electrical connectors on said panel adjacent to each said switch means of said second array, each of said third connectors of each said pair being connected to a corresponding contact of the adjacent said switch means of said second array, and indicia on said operator panel adjacent to each said switch means and corresponding pair of said third connectors in said second array for identifying the contacts of said fourth and fifth connectors associated with said adjacent switch means and pair of third connectors in said second array.

6. The apparatus set forth in claim 1 or 3 further comprising an electrical meter on said operator panel and a pair of said third connectors adjacent to said meter for selectively electrically connecting said meter across one of said switch means.

7. The apparatus set forth in claim 1 or 3 further comprising a source of electrical power and a said operator third connector on said panel for selectively connecting said source of electrical power to said switch means.

8. The apparatus set forth in claim 7 further comprising means on said operator panel for selectively varying level of said electrical power.

* * * * *